(12) United States Patent
Wang et al.

(10) Patent No.: US 10,043,461 B2
(45) Date of Patent: Aug. 7, 2018

(54) SHIFT REGISTER UNIT, GATE DRIVING CIRCUIT AND DISPLAY DEVICE

(71) Applicants: BOE TECHNOLOGY GROUP CO., LTD., Beijing (CN); Chongqing BOE Optoelectronics Technology Co., Ltd, Chongqing (CN)

(72) Inventors: Rui Wang, Beijing (CN); Fei Shang, Beijing (CN); Shaoru Li, Beijing (CN); Wu Wang, Beijing (CN)

(73) Assignees: BOE TECHNOLOGY GROUP CO., LTD., Beijing (CN); CHONGQING BOE OPTOELECTRONICS TECHNOLOGY CO., LTD., Chongqing (CN)

( * ) Notice: Subject to any disclaimer, the term of this patent is extended or adjusted under 35 U.S.C. 154(b) by 133 days.

(21) Appl. No.: 14/740,661

(22) Filed: Jun. 16, 2015

(65) Prior Publication Data

US 2016/0111065 A1    Apr. 21, 2016

(30) Foreign Application Priority Data

Oct. 21, 2014    (CN) .......................... 2014 1 0561541

(51) Int. Cl.
   *G09G 3/36*    (2006.01)
   *G09G 3/00*    (2006.01)
   *G11C 19/28*   (2006.01)

(52) U.S. Cl.
   CPC .......... *G09G 3/3611* (2013.01); *G09G 3/3677* (2013.01); *G11C 19/28* (2013.01);
   (Continued)

(58) Field of Classification Search
   CPC .......... G09G 3/22; G09G 3/3208; G09G 3/30; G09G 3/3225; G09G 3/3233;
   (Continued)

(56) References Cited

U.S. PATENT DOCUMENTS

| | | | | |
|---|---|---|---|---|
| 8,019,039 B1* | 9/2011 | Tsai | ..................... | G11C 19/184 377/64 |
| 2003/0231735 A1* | 12/2003 | Moon | .................. | G09G 3/3685 377/64 |

(Continued)

FOREIGN PATENT DOCUMENTS

| | | | |
|---|---|---|---|
| CN | 101598859 A | 12/2009 | |
| CN | 102012591 A | 4/2011 | |

(Continued)

OTHER PUBLICATIONS

Office Action dated Mar. 21, 2016 issued in corresponding Chinese Application No. 201410561541.1.

*Primary Examiner* — William Lu
(74) *Attorney, Agent, or Firm* — Nath, Goldberg & Meyer; Joshua B. Goldberg

(57) ABSTRACT

The present invention provides a shift register unit, a gate driving circuit and a display device. The shift register unit comprises a pull-up module, an output module and a pull-down module. The output module comprises a plurality of output lines, and a driving transistor is arranged on each output line. A switching device is arranged on at least one output line and used for turning on or turning off the output line.

22 Claims, 2 Drawing Sheets

(52) U.S. Cl.
CPC ............... *G09G 2300/0408* (2013.01); *G09G 2310/0286* (2013.01)

(58) Field of Classification Search
CPC .. G09G 3/3241; G09G 3/3266; G09G 3/3275; G09G 3/3258
See application file for complete search history.

(56) References Cited

U.S. PATENT DOCUMENTS

| | | | | |
|---|---|---|---|---|
| 2005/0275609 A1* | 12/2005 | Lee | ...................... | G09G 3/3677 345/82 |
| 2007/0040793 A1* | 2/2007 | Kim | ..................... | G11C 19/184 345/100 |
| 2007/0217564 A1* | 9/2007 | Tobita | .................... | G11C 19/28 377/64 |
| 2007/0248204 A1* | 10/2007 | Tobita | .................... | G11C 19/28 377/64 |
| 2009/0189679 A1* | 7/2009 | Lee | ...................... | G09G 3/3677 327/436 |
| 2010/0182227 A1* | 7/2010 | Tsou | .................... | G09G 3/3677 345/100 |
| 2012/0127138 A1* | 5/2012 | Tsuchi | .................. | H03F 1/0261 345/204 |
| 2014/0119492 A1* | 5/2014 | Liu | ........................ | G11C 19/28 377/64 |
| 2014/0152629 A1* | 6/2014 | So | .......................... | G11C 19/28 345/205 |
| 2016/0125955 A1* | 5/2016 | Pang | .................... | G11C 19/287 377/64 |
| 2017/0178581 A1* | 6/2017 | Li | ........................ | G09G 3/3655 |

FOREIGN PATENT DOCUMENTS

| | | |
|---|---|---|
| CN | 102682699 A | 9/2012 |
| CN | 102760409 A | 10/2012 |
| CN | 103413531 A | 11/2013 |

* cited by examiner

SHIFT REGISTER UNIT, GATE DRIVING CIRCUIT AND DISPLAY DEVICE

FIELD OF THE INVENTION

The present invention relates to the field of liquid crystal display technology, and specifically relates to a shift register unit, a gate driving circuit including the shift register unit and a display device including the gate driving circuit.

BACKGROUND OF THE INVENTION

With the development of thin film transistor liquid crystal displays (Thin Film Transistor Liquid Crystal Display) towards high integration and low cost, a gate-driver on array (Gate-driver on Array, GOA for short) technology appears, namely a gate driving circuit is prepared on an array substrate to reduce the cost of a product on the material cost and the manufacturing process.

The gate driving circuit includes multiple stages of shift register units, and each stage of shift register unit is used for outputting a gate driving signal to a row of gate line on the array substrate. FIG. 1 is a schematic diagram of a shift register unit of an existing gate driving circuit; and FIG. 2 is a time sequence diagram of each signal input to the shift register unit shown in FIG. 1. As shown in FIG. 1 and FIG. 2, the gate driving circuit is prepared on an array substrate, and each stage of shift register unit 1 of the gate driving circuit includes a pull-up module, an output module and a pull-down module, wherein the pull-up module is used for controlling the turn-on of the output module through a pull-up node PU, the output module is used for outputting a first clock signal CLK as a gate driving signal during turn-on, and the pull-down module is used for controlling the turn-off of the pull-up module and/or the output module through a pull-down node PD. The pull-up module includes a first transistor 201, a second transistor 202, a seventh transistor 207 and a first capacitor C1; the output module includes a third transistor 203, a fourth transistor 204 and a signal output terminal OUTPUT; and the pull-down module includes a ninth transistor 209, a fifth transistor 205, an eighth transistor 208, a sixth transistor 206, a tenth transistor 210 and an eleventh transistor 211. The connection relation of the first transistor 201 to the eleventh transistor 211 and the first capacitor C1 is shown as FIG. 1. In the shift register unit, besides the input CLK signal serving as the gate driving signal, a CLKB signal is also input as a second clock signal, an STV signal is input as a start signal, an STV1 signal is input as a correction signal, a RESET signal is input as a reset signal, and a VGL signal is input as a low voltage signal.

In the shift register unit, the size of the active layer of each transistor (mainly the third transistor) is a key factor influencing the display effect of the TFT LCD; if the active layer in the third transistor is too small, the driving capability of the shift register unit may be insufficient, particularly at a low temperature, the carrier mobility is reduced, the driving capability of the shift register unit is seriously insufficient, and then abnormal display of the TFT LCD is caused; and if the active layer in the third transistor is too large, when the CLK is of a high level, the pull-up node PU may be coupled to increase the voltage of the pull-up node PU, so that the shift register unit outputs multiple signals (Multi outputs) to the outside, and then abnormal display of the TFT LCD is caused.

SUMMARY OF THE INVENTION

The present invention aims to at least solve one of the technical problems in the prior art and provides a shift register unit, a gate driving circuit and a display device. The shift register unit can adjust the driving capability of a gate driving signal output to the outside, so as to solve the problems of insufficient driving capability or over large driving capability of the shift register unit and abnormal display of the display device.

To fulfill an aim of the present invention, provided is a shift register unit, including a pull-up module, an output module and a pull-down module, wherein the pull-up module is used for turning on the output module, the output module is used for outputting a first clock signal as a gate driving signal during turn-on, and the pull-down module is used for turning off the pull-up module and/or the output module; the output module includes a plurality of output lines, a driving transistor is arranged on each output line, a gate of the driving transistor is connected with the pull-up module, a first electrode of the driving transistor is used for inputting a first clock signal, and a second electrode of the driving transistor is used for outputting a gate driving signal; and a switching device is arranged on at least one output line and used for turning on or turning off the output line.

In an embodiment, in the output module, only one output line is provided with no switching device.

In an embodiment, in the output module, the switching device is arranged on each output line.

In an embodiment, the switching device is a switching transistor.

In an embodiment, a gate of the switching transistor is connected with a switching signal terminal, and a first electrode and a second electrode of the switching transistor are used for introducing the first clock signal to the first electrode of the driving transistor on the output line where the switching transistor is located, or enabling the second electrode of the driving transistor on the output line where the switching transistor is located to output the gate driving signal.

In an embodiment, a gate of the switching transistor is connected with a switching signal terminal, a first electrode of the switching transistor is connected with the pull-up module, and a second electrode of the switching transistor is connected with the gate of the driving transistor on the output line where the switching transistor is located.

In an embodiment, a second capacitor is arranged on each output line provided with the switching transistor, one end of the second capacitor is connected with the switching signal terminal, and the other end of the second capacitor is connected with the gate of the driving transistor on the output line.

In an embodiment, the number of the output lines ranges from 2 to 10.

As another technical scheme, the present invention further provides a gate driving circuit, including multiple stages of shift register units, wherein the shift register units are the above ones provided by the present invention.

As another technical scheme, the present invention further provides a display device, including an array substrate and a gate driving circuit, wherein a plurality of thin film transistors are prepared on the array substrate, the gate driving circuit is used for driving the plurality of thin film transistors to be turned on or turned off, and the gate driving circuit is the above one provided by the present invention.

The present invention has the following beneficial effects.

According to the shift register unit provided by the present invention, turn-on or turn-off of the corresponding output line can be controlled by the switching device, to adjust the voltage value output by the output module, namely the driving capability of the gate driving signal, thus solving the problems of insufficient driving capability of the gate driving signal and abnormal display of the display device, and also solving the problems of over large driving capability of the gate driving signal and multiple signal output of the output module and abnormal display of the display device.

The gate driving circuit provided by the present invention, which adopts the above shift register unit provided by the present invention, can solve the problems of insufficient driving capability of the gate driving signal and abnormal display of the display device, and also solve the problems of over large driving capability of the gate driving signal and multiple signal output of the output module and abnormal display of the display device.

The display device provided by the present invention, which adopts the gate driving circuit provided by the present invention, can solve the problem of abnormal display of the display device due to insufficient driving capability or over large driving capability of the gate driving signal.

BRIEF DESCRIPTION OF THE DRAWINGS

The accompanying drawings are included to provide a further understanding of the present invention and form a part of the specification, and are used to explain the present invention together with the following specific embodiments, rather than to limit the present invention. In the drawings.

REFERENCE NUMERALS

201: first transistor; 202: second transistor; 203: third transistor; 204: fourth transistor; 205: fifth transistor; 206: sixth transistor; 207: seventh transistor; 208: eighth transistor; 209: ninth transistor; 210: tenth transistor; 211: eleventh transistor; 212: twelfth transistor; 213: thirteen transistors; 214: fourteenth transistor; 215: fifteenth transistor; 300: signal output terminal; 301: start signal terminal; 302: reset signal terminal; 303: low voltage terminal; 304: first clock signal terminal; 305: second clock signal terminal; 306: correction signal terminal; 307: first switching signal terminal; 308: second switching signal terminal; C1: first capacitor; C2: second capacitor.

DETAILED DESCRIPTION OF THE EMBODIMENTS

The specific embodiments of the present invention will be described in detail below in conjunction with the accompanying drawings. It should be understood that, the specific embodiments described herein are merely used for describing and interpreting the present invention, rather than limiting the present invention. In the description, "connection" or "coupling" between one component or element and another component or element can indicate direct connection of the both or indicate that an intermediate component or element exists between the both.

Figure 1:
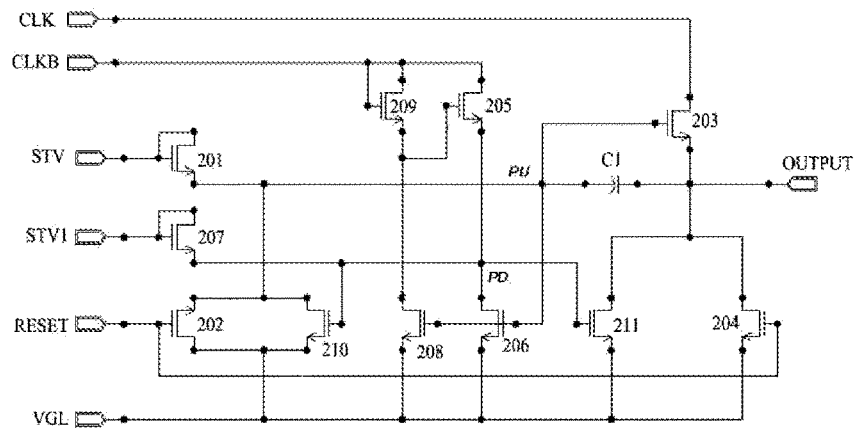
FIG. 1 is a schematic diagram of a shift register unit of an existing gate driving circuit.
Figure 2:
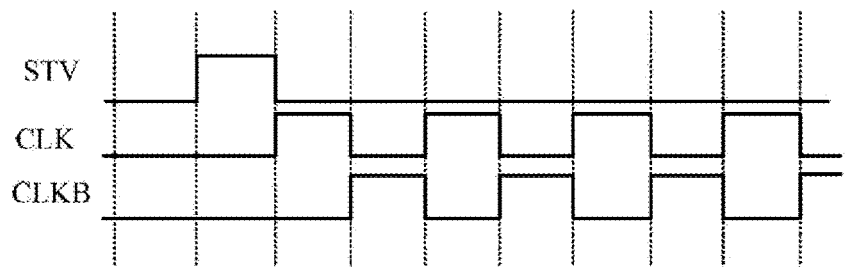
FIG. 2 is a time sequence diagram of each signal input to the shift register unit shown in FIG. 1.
Figure 3:
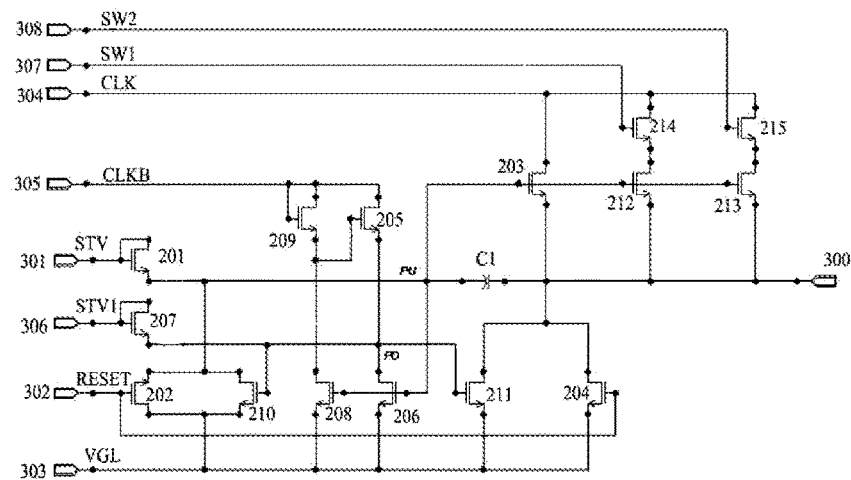
FIG. 3 is a schematic diagram of an example of a shift register unit according to a first embodiment of the present invention.
Figure 4:
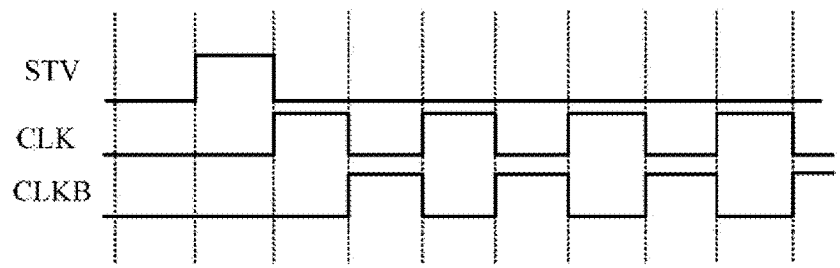
FIG. 4 is a time sequence diagram of each signal input to the shift register unit shown in FIG. 3.

FIG. 3 is a schematic diagram of an example of a shift register unit according to a first embodiment of the present invention; and FIG. 4 is a time sequence diagram of each signal input to the shift register unit shown in FIG. 3. As shown in FIG. 3 and FIG. 4, in this embodiment, the shift register unit includes a pull-up module, an output module and a pull-down module, wherein the pull-up module is used for turning on the output module, the output module is used for outputting a first clock signal CLK as a gate driving signal during turn-on, and the pull-down module is used for turning off the pull-up module and/or the output module.

In this embodiment, the output module includes a plurality of output lines, a driving transistor is arranged on each output line, the gate of the driving transistor is connected with the pull-up module, the first electrode of the driving transistor is used for inputting the first clock signal CLK, and the second electrode of the driving transistor is used for outputting a gate driving signal; and a switching device is arranged on at least one output line and used for turning on or turning off the output line. The "first electrode" is the source of the driving transistor, and the "second electrode" is the drain of the driving transistor; or the "first electrode" is the drain of the driving transistor, and the "second electrode" is the source of the driving transistor.

The output module includes the plurality of output lines, and the switching device is arranged on at least one output line, so under the condition that the gate driving signal is too weak, the corresponding output line can be controlled to be turn-on by the switching device to increase the driving capability of the gate driving signal output by the output module, thus solving the problems of insufficient driving capability of the gate driving signal and abnormal display of the display device; and under the condition that the gate driving signal is too intensive, turn-off of the corresponding output line can be controlled by the switching device to reduce the driving capability of the gate driving signal output by the output module, thus solving the problems of multiple signal output of the output module and abnormal display of the display device.

Specifically, in the output module, only one output line is provided with no switching device, in this way, the driving capability of the driving transistor in the output line is used as the basic driving capability of the output module (that is, the lowest driving capability of the output module), and the overall driving capability of the output module is adjusted by controlling turn-on and turn-off of other output lines based on the basic driving capability; or, in the output module, the switching device is arranged on each output line, in this way, the lowest driving capability of the output module is 0, and under such a condition, the adjusting range of the driving capability of the output module is maximum.

In this embodiment, preferably, the switching transistor is a switching transistor; and the gate of the switching transistor is connected with a switching control signal terminal, and the first electrode and the second electrode of the switching transistor are used for introducing the first clock signal CLK to the first electrode of the driving transistor on the output line where the switching transistor is located, or enabling the second electrode of the driving transistor on the output line where the switching transistor is located to output the gate driving signal.

A specific circuit structure of an example of the shift register unit according to the first embodiment of the present invention will be described below in conjunction with FIG. 3 and FIG. 4, taking three output lines in the output module as an example.

As shown in FIG. 3, the pull-up module includes a first transistor 201, a second transistor 202, a seventh transistor 207 and a first capacitor C1; the output module includes a third transistor 203, a fourth transistor 204, a twelfth transistor 212, a thirteenth transistor 213, a fourteenth transistor 214, a fifteenth transistor 215 and a signal output terminal 300, wherein the fourteenth transistor 214 and the fifteenth transistor 215 are used as switching devices; and the pull-down module includes a ninth transistor 209, a fifth transistor 205, an eighth transistor 208, a sixth transistor 206, a tenth transistor 210 and an eleventh transistor 211.

Specifically, the gate and the first electrode of the first transistor 201 are connected with a start signal terminal 301, the start signal terminal 301 is used for inputting a start signal STV, and the second electrode of the first transistor 201 is connected with one end of the first capacitor C1; the other end of the first capacitor C1 is connected with the signal output terminal 300; and the connection point of the second electrode of the first transistor 201 and the first capacitor C1 is a pull-up node PU serving as a control end, for controlling the output module, of the pull-up module.

The gate of the second transistor 202 is connected with a reset signal terminal 302, and the reset signal terminal 302 is used for inputting a reset signal RESET; the first electrode of the second transistor 202 is connected with a low voltage terminal 303, and the low voltage terminal 303 is used for inputting a low voltage signal VGL; and the second electrode of the second transistor 202 is connected with the pull-up node PU.

The gate of the third transistor 203 is connected with the pull-up node PU, the first electrode of the third transistor 203 is connected with a first clock signal terminal 304, and the first clock signal terminal 304 is used for inputting a first clock signal CLK; and the second electrode of the third transistor 203 is connected with the signal output terminal 300.

The gate of the fourth transistor 204 is connected with the reset signal terminal 302, the second electrode of the fourth transistor 204 is connected with the low voltage terminal 303, and the first electrode of the fourth transistor 204 is connected with the signal output terminal 300.

The gate of the fifth transistor 205 is connected with the first electrode of the eighth transistor 208 and the second electrode of the ninth transistor 209, the first electrode of the fifth transistor 205 is connected with a second clock signal terminal 305, and the second clock signal terminal 305 is used for inputting a second clock signal CLKB; and the second electrode of the fifth transistor 205 is connected with the second electrode of the sixth transistor 206, and the connection point of the both is a pull-down node PD serving as a control end, for controlling the turn-on or turn-off of the pull-up module and/or the output module, of the pull-down module.

The gate of the sixth transistor 206 is connected with the pull-up node PU, the second electrode of the sixth transistor 206 is connected with the low voltage terminal 303, and the first electrode of the sixth transistor 206 is connected with the pull-down node PD.

The gate and the first electrode of the seventh transistor 207 are connected with a correction signal terminal 306, and the correction signal terminal 306 is used for inputting a correction signal STV1; and the second electrode of the seventh transistor 207 is connected with the pull-down node PD.

The gate of the eighth transistor 208 is connected with the pull-up node PU, the second electrode of the eighth transistor 208 is connected with the low voltage terminal 303, and the first electrode of the eighth transistor 208 is connected with the gate of the fifth transistor 205.

The gate and the first electrode of the ninth transistor 209 are connected with the second clock signal terminal 305, and the second electrode of the ninth transistor 209 is connected with the gate of the fifth transistor 205.

The gate of the tenth transistor 210 is connected with the pull-down node PD, the second electrode of the tenth transistor 210 is connected with the low voltage terminal 303, and the first electrode of the tenth transistor 210 is connected with the pull-up node PU.

The gate of the eleventh transistor 211 is connected with the pull-down node PD, the second electrode of the eleventh transistor 211 is connected with the low voltage terminal 303, and the first electrode of the eleventh transistor 211 is connected with the signal output terminal 300.

The gate of the twelfth transistor 212 is connected with the pull-up node PU, the first electrode of the twelfth transistor 212 is connected with the second electrode of the fourteenth transistor 214, and the second electrode of the twelfth transistor 212 is connected with the signal output terminal 300.

The gate of the thirteenth transistor 213 is connected with the pull-up node PU, the first electrode of the thirteenth transistor 213 is connected with the second electrode of the fifteenth transistor 215, and the second electrode of the thirteenth transistor 213 is connected with the signal output terminal 300.

The gate of the fourteenth transistor 214 is connected with a first switching signal terminal 307, and the first switching signal terminal 307 is used for inputting a first switching signal SW1; the first electrode of the fourteenth transistor 214 is connected with the first clock signal terminal 304, and the second electrode of the fourteenth transistor 214 is connected with the first electrode of the twelfth transistor 212.

The gate of the fifteenth transistor 215 is connected with a second switching signal terminal 308, and the second switching signal terminal 308 is used for inputting a second switching signal SW2; the first electrode of the fifteenth transistor 215 is connected with the first clock signal terminal 304, and the second electrode of the fifteenth transistor 215 is connected with the first electrode of the thirteenth transistor 213.

As for this embodiment, turn-on and turn-off of the fourteenth transistor 214 and the fifteenth transistor 215 are respectively controlled by the first switching signal SW1 and the second switching signal SW2, and then turn-on or turn-off of the output lines where the twelfth transistor 212 and the thirteenth transistor 213 are located is respectively controlled. When the driving capability of the voltage output by the signal output terminal 300 is insufficient (that is, the voltage of the gate driving signal is too low to drive the corresponding pixel unit), the output lines where the twelfth transistor 212 and the thirteenth transistor 213 are located is sequentially controlled to be turn-on, to gradually increase the voltage output by the signal output terminal 300, till the gate driving signal has the capability of driving the pixel unit.

In this embodiment, when the voltage supplied from the third transistor 203 to the signal output terminal 300 has sufficient driving capability and can drive the thin film transistor (e.g. under some conditions of room temperature or high temperature), the output lines where the twelfth transistor 212 and the thirteenth transistor 213 are located is controlled to be turn-off so that over high noise caused by coupling among the third transistor 203, the twelfth transistor 212 and the thirteenth transistor 213 can be avoided.

In the example shown in FIG. 3, the output module includes three output lines, but the structure of the output lines of the shift register unit provided by the first embodiment of the present invention is not limited thereto, and the number of the output lines may be at least two, preferably may range from 2 to 10.

It should be also noted that, the circuit structure of the shift register unit of the example shown in FIG. 3 is merely an optional one of the first embodiment of the present invention, and besides the example shown in FIG. 3, the first embodiment of the present invention may also adopt other circuit structure.

According to the above description, in the shift register unit of the first embodiment of the present invention, turn-on or turn-off of the corresponding output line can be controlled by the switching device, to adjust the voltage value output by the output module, namely the driving capability of the gate driving signal, thus solving the problems of insufficient driving capability of the gate driving signal and abnormal display of the display device, and also solving the problems of over large driving capability of the gate driving signal and multiple signal output of the output module and abnormal display of the display device.

Figure 5:
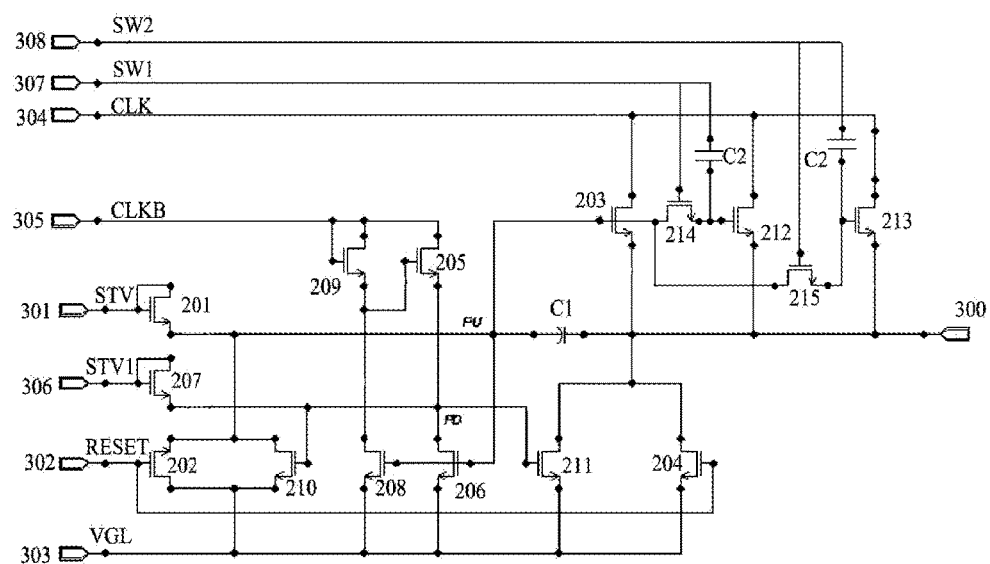
FIG. 5 is a schematic diagram of an example of a shift register unit according to a second embodiment of the present invention.

Referring to FIG. 5, a schematic diagram of an example of a shift register unit according to a second embodiment of the present invention is shown. In this embodiment, the shift register unit includes a pull-up module, an output module and a pull-down module likewise. Since detailed description has been given in the first embodiment, the similarities between this embodiment and the first embodiment are not redundantly described.

The difference between this embodiment and the first embodiment will be described in detail below. In this embodiment, a second capacitor C2 is arranged on each output line of the output module, one end of the second capacitor C2 is connected with the gate of the driving transistor on the corresponding output line, and the other end of the second capacitor C2 is connected with the switching control signal terminal, so that when the output module outputs the gate driving signal and the gate driving signal is of a high level, the problems that the driving transistor on the output line which should have been in a turn-off state is turned on due to coupling of the gate driving signal and then the driving capability of the gate driving signal can not be adjusted are solved.

A specific circuit structure of an example of the shift register unit according to the second embodiment of the present invention will be described below in conjunction with FIG. 5, taking three output lines in the output module as an example. In the shift register unit shown in FIG. 5, the time sequence of each signal is the same as that shown in FIG. 4.

In this example, the structures (including each component and the connection relation among the components) of the pull-up module and the pull-down module are the same as those of the example shown in FIG. 3, whereas the structure of the output module is different from that of the example shown in FIG. 3. Specifically, in this example, the output module includes a twelfth transistor 212, a thirteenth transistor 213, a fourteenth transistor 214, a fifteenth transistor 215 and two second capacitors C2. The fourteenth transistor 214 is used as a switching device, the gate of the fourteenth transistor 214 is connected with the first switching signal terminal 307, the first electrode of the fourteenth transistor 214 is connected with the pull-up node PU, and the second electrode of the fourteenth transistor 214 is connected with the gate of the twelfth transistor 212. The first electrode of the twelfth transistor 212 is connected with the first clock signal terminal 304, and the second electrode of the twelfth transistor 212 is connected with the signal output terminal 300. The fifteenth transistor 215 is used as a switching device, the gate of the fifteenth transistor 215 is connected with the second switching signal terminal 308, the first electrode of the fifteenth transistor 215 is connected with the pull-up node PU, and the second electrode of the fifteenth transistor 215 is connected with the gate of the thirteenth transistor 213. The first electrode of the thirteenth transistor 213 is connected with the first clock signal terminal 304, and the second electrode of the thirteenth transistor 213 is connected with the signal output terminal 300. One ends of the two second capacitors C2 are respectively connected with the gates of the twelfth transistor 212 and the thirteenth transistor 213, and the other ends of the both can be respectively connected with the first switching signal terminal 307 and the second switching signal terminal 308 or simultaneously connected with the first switching signal terminal 307 or the second switching signal terminal 308.

In conclusion, the shift register unit provided by the present invention can control the turn-on or turn-off of the corresponding output line by the switching device, to adjust the voltage value output by the output module, namely the driving capability of the gate driving signal, thus solving the problems of insufficient driving capability of the gate driving signal and abnormal display of the display device, and also solving the problems of over large driving capability of the gate driving signal and multiple signal output of the output module and abnormal display of the display device.

As another aspect of the present invention, the present invention further provides a gate driving circuit, including multiple stages of shift register units which are the above ones provided by the present invention.

The gate driving circuit provided by the present invention, which adopts the above shift register unit provided by the present invention, can solve the problems of insufficient driving capability of the gate driving signal and abnormal display of the display device, and also solve the problems of over large driving capability of the gate driving signal and multiple signal output of the output module and abnormal display of the display device.

As another aspect of the present invention, the present invention further provides a display device, including an array substrate and a gate driving circuit, wherein a plurality of thin film transistors are prepared on the array substrate, the gate driving circuit is used for driving the plurality of thin film transistors to be turned on or turned off, and the gate driving circuit is the above one provided by the present invention.

The display device provided by the present invention, which adopts the gate driving circuit provided by the present invention, can solve the problem of abnormal display of the display device due to insufficient driving capability or over large driving capability of the gate driving signal.

It could be understood that, the above embodiments are merely exemplary embodiments adopted for describing the principle of the present invention, rather than limiting the present invention. Various variations and improvements may be made for those of ordinary skill in the art without departing from the spirit and essence of the present invention. The technical features in an embodiment can be combined into another embodiment without conflict, and vice versa. These variations and improvements are regarded within the protection scope of the present invention.

The invention claimed is:

1. A shift register unit, comprising a pull-up module, an output module and a pull-down module, wherein the pull-up module is used for turning on the output module, the output module is used for outputting, through an output terminal of the shift register unit, a first clock signal as a gate driving signal during turn-on, and the pull-down module is used for turning off the pull-up module and/or the output module; the output module comprises a plurality of output lines, a driving transistor is arranged on each output line, a gate of the driving transistor is connected with the pull-up module, a first electrode of the driving transistor is used for inputting a first clock signal, and a second electrode of the driving transistor is used for outputting a gate driving signal, and the pull-up module, the output module and the pull-down module do not share any element with each other, the plurality of output lines are connected, in parallel, between a first clock terminal configured to provide the first clock signal and the output terminal of the shift register unit; and a switching device is arranged on at least one output line and configured to turn on or turn off the output line under control of a switch signal independent from other signals, such that the first clock signal is transmitted via the output line from the first clock terminal to the output terminal when the output line is turned on, while the first clock signal cannot be transmitted to the output terminal when the output line is turned off.

2. The shift register unit of claim 1, wherein one of the output lines in the output module is a basic output line, and the switching device is arranged on each of other output lines except the basic output line.

3. The shift register unit of claim 1, wherein in the output module, the switching device is arranged on each output line.

4. The shift register unit of claim 1, wherein the switching device is a switching transistor.

5. The shift register unit of claim 4, wherein a gate of the switching transistor is connected with a switching signal terminal, and a first electrode and a second electrode of the switching transistor are used for introducing the first clock signal to the first electrode of the driving transistor on the output line where the switching transistor is located, or enabling the second electrode of the driving transistor on the output line where the switching transistor is located to output the gate driving signal.

6. The shift register unit of claim 4, wherein a gate of the switching transistor is connected with a switching signal terminal, a first electrode of the switching transistor is connected with the pull-up module, and a second electrode of the switching transistor is connected with the gate of the driving transistor on the output line where the switching transistor is located.

7. The shift register unit of claim 5, wherein a second capacitor is arranged on each output line provided with the switching transistor, one end of the second capacitor is connected with the switching signal terminal, and the other end of the second capacitor is connected with the gate of the driving transistor on the output line.

8. The shift register unit of claim 6, wherein a second capacitor is arranged on each output line provided with the switching transistor, one end of the second capacitor is connected with the switching signal terminal, and the other end of the second capacitor is connected with the gate of the driving transistor on the output line.

9. The shift register unit of claim 1, wherein a number of the output lines ranges from 2 to 10.

10. A gate driving circuit, comprising multiple stages of shift register units, wherein the shift register units are the ones of claim 1.

11. The gate driving circuit of claim 10, wherein one of the output lines in the output module is a basic output line, and the switching device is arranged on each of other output lines except the basic output line.

12. The gate driving circuit of claim 10, wherein in the output module, the switching device is arranged on each output line.

13. A display device, comprising an array substrate and a gate driving circuit, wherein a plurality of thin film transistors are prepared on the array substrate, the gate driving circuit is used for driving the plurality of thin film transistors to be turned on or turned off, and the gate driving circuit is the one of claim 10.

14. The display device of claim 13, wherein one of the output lines in the output module is a basic output line, and the switching device is arranged on each of other output lines except the basic output line.

15. The display device of claim 13, wherein in the output module, the switching device is arranged on each output line.

16. The display device of claim 13, wherein the switching device is a switching transistor.

17. The display device of claim 16, wherein a gate of the switching transistor is connected with a switching signal terminal, and a first electrode and a second electrode of the switching transistor are used for introducing the first clock signal to the first electrode of the driving transistor on the output line where the switching transistor is located, or enabling the second electrode of the driving transistor on the output line where the switching transistor is located to output the gate driving signal.

18. The display device of claim 16, wherein a gate of the switching transistor is connected with a switching signal terminal, a first electrode of the switching transistor is connected with the pull-up module, and a second electrode of the switching transistor is connected with the gate of the driving transistor on the output line where the switching transistor is located.

19. The display device of claim 17, wherein a second capacitor is arranged on each output line provided with the switching transistor, one end of the second capacitor is connected with the switching signal terminal, and the other end of the second capacitor is connected with the gate of the driving transistor on the output line.

20. The display device of claim 18, wherein a second capacitor is arranged on each output line provided with the switching transistor, one end of the second capacitor is connected with the switching signal terminal, and the other end of the second capacitor is connected with the gate of the driving transistor on the output line.

21. The shift register unit of claim 1, wherein the switching device is configured to turn on or turn off the output line according to required driving capability of the gate driving signal.

22. The shift register unit of claim 5, wherein the switching transistor is connected in series with the driving transistor on the output line where the switching transistor is located.

* * * * *